{(12)} United States Patent  
Wodzinski et al.

(10) Patent No.: US 7,415,394 B2  
(45) Date of Patent: Aug. 19, 2008

(54) INTEGRATED MODULARITY DESIGN

(75) Inventors: Dennis John Wodzinski, Erie, PA (US); Warren Anthony Leone, Erie, PA (US)

(73) Assignee: General Electric Company, Schenectady, NY (US)

( * ) Notice: Subject to any disclaimer, the term of this patent is extended or adjusted under 35 U.S.C. 154(b) by 541 days.

(21) Appl. No.: 10/970,775

(22) Filed: Oct. 21, 2004

(65) Prior Publication Data

US 2006/0089821 A1    Apr. 27, 2006

(51) Int. Cl.
G06F 17/50 (2006.01)
B21D 43/28 (2006.01)
B21D 31/02 (2006.01)
B21K 27/06 (2006.01)

(52) U.S. Cl. ............... 703/1; 72/324; 72/325

(58) Field of Classification Search .......... 703/1; 72/324

See application file for complete search history.

(56) References Cited

U.S. PATENT DOCUMENTS 6,877,349 B2 *  4/2005  Durney et al. ............. 72/324

* cited by examiner

*Primary Examiner*—Kamini Shan
*Assistant Examiner*—Saif A Alhija
(74) *Attorney, Agent, or Firm*—Steven M. McHugh; Carlos Hanze

(57) ABSTRACT

A method for developing a product is provided, wherein the method includes developing a three-dimensional product design, translating the three-dimensional product design into a two-dimensional product design, wherein the two-dimensional product design includes at least one product structure having at least two structure sections, obtaining a rigidly malleable material to create the at least one product structure, wherein the rigidly malleable material is obtained based on the two-dimensional product design, generating the at least one product structure by shaping the rigidly malleable material based on the two-dimensional product design such that the at least one product structure includes the at least two structure sections separated by at least one forming groove and at least one forming tab, the at least one forming tab having a forming tab height and a forming tab width and hand forming the product structure based on the at least one forming groove.

18 Claims, 11 Drawing Sheets

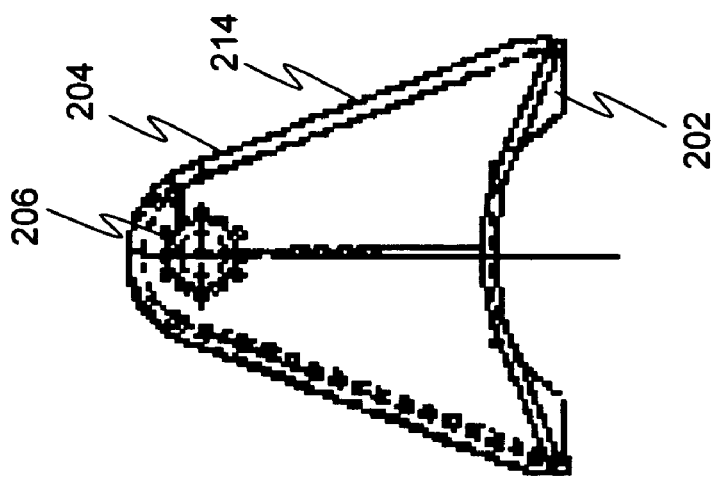
*Figure 5*
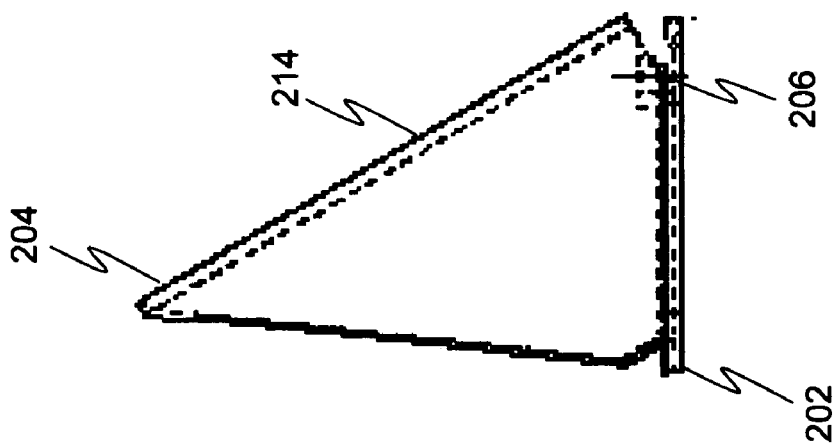
*Figure 4*

Hand Bend Calculator

↙ 398

| Material thickness | length of bend line | Shortest leg height | No. of tabs | Tab Width | | | Slot size | Total push/pull force req. in lbs. |
|---|---|---|---|---|---|---|---|---|
| 0.060 | 1.000 | 1.000 | 2 | 0.120 | >>>>>>>>> | | .04 slot | 3.31 |
| 0.090 | 22.000 | 4.000 | 5 | 0.120 | >>>>>>>>> | | .06 slot | 6.99 |
| 0.120 | 8.760 | 8.680 | 2 | 0.120 | >>>>>>>>> | | .09 slot | 3.43 |
| 0.179 | 1.000 | 1.000 | 2 | 0.120 | >>>>>>>>> | | .09 slot | 66.32 |
| 0.250 | 1.000 | 1.000 | 2 | 0.180 | >>>>>>>>> | | .09 slot | 194.06 |

Insert Dimensions in Blue Cells

| Matl. Thk. | Tab Width | Pref. Distance between Tabs |
|---|---|---|
| 0.060 | 0.120 | 6.00 inches |
| 0.090 | 0.120 | 6.00 inches |
| 0.120 | 0.120 | 6.00 inches |
| 0.179 | 0.120 | 14.00 inches |
| 0.250 | 0.180 | 14.00 inches |

| | Matl. Thk. | Matl factor | Total push/pull force req. in lbs. |
|---|---|---|---|
| Stainless steel | 0.060 | 1.40 | 4.64 |
| Stainless steel | 0.090 | 1.40 | 9.78 |
| Stainless steel | 0.120 | 1.40 | 4.81 |
| Stainless steel | 0.179 | 1.40 | 92.85 |
| Stainless steel | 0.250 | 1.40 | 271.69 |

MASS CANNOT EXCEED FORCE

Insert number of tabs

| Material thickness | length of bend line | Shortest leg height | No. of tabs | Tab Width | Mass of flange in lbs. | Slot size | Total push/pull force req. in lbs. |
|---|---|---|---|---|---|---|---|
| 0.060 | 1.000 | 1.000 | 1 | 0.120 | 0.02 | .04 slot | 1.66 |
| 0.090 | 22.000 | 4.000 | 10 | 0.120 | 2.24 | .06 slot | 13.97 |
| 0.120 | 8.760 | 8.680 | 16 | 0.120 | 2.58 | .09 slot | 27.47 |
| 0.179 | 1.000 | 1.000 | 1 | 0.120 | 0.05 | .09 slot | 44.22 |
| 0.250 | 1.000 | 1.000 | 1 | 0.180 | 0.07 | .09 slot | 194.06 |

Figure 7

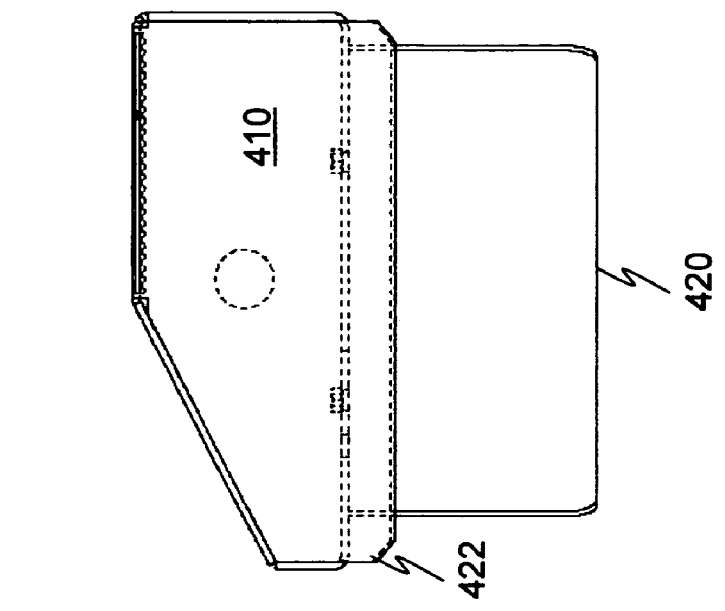
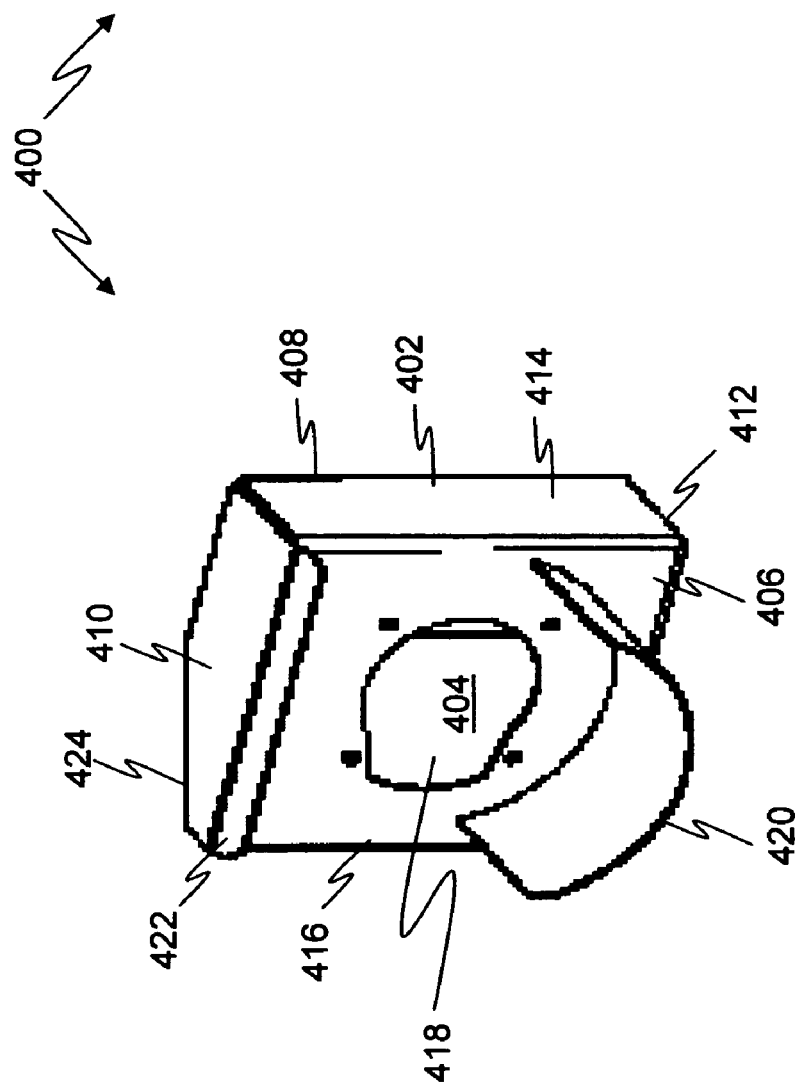
*Figure 9*
*Figure 8*

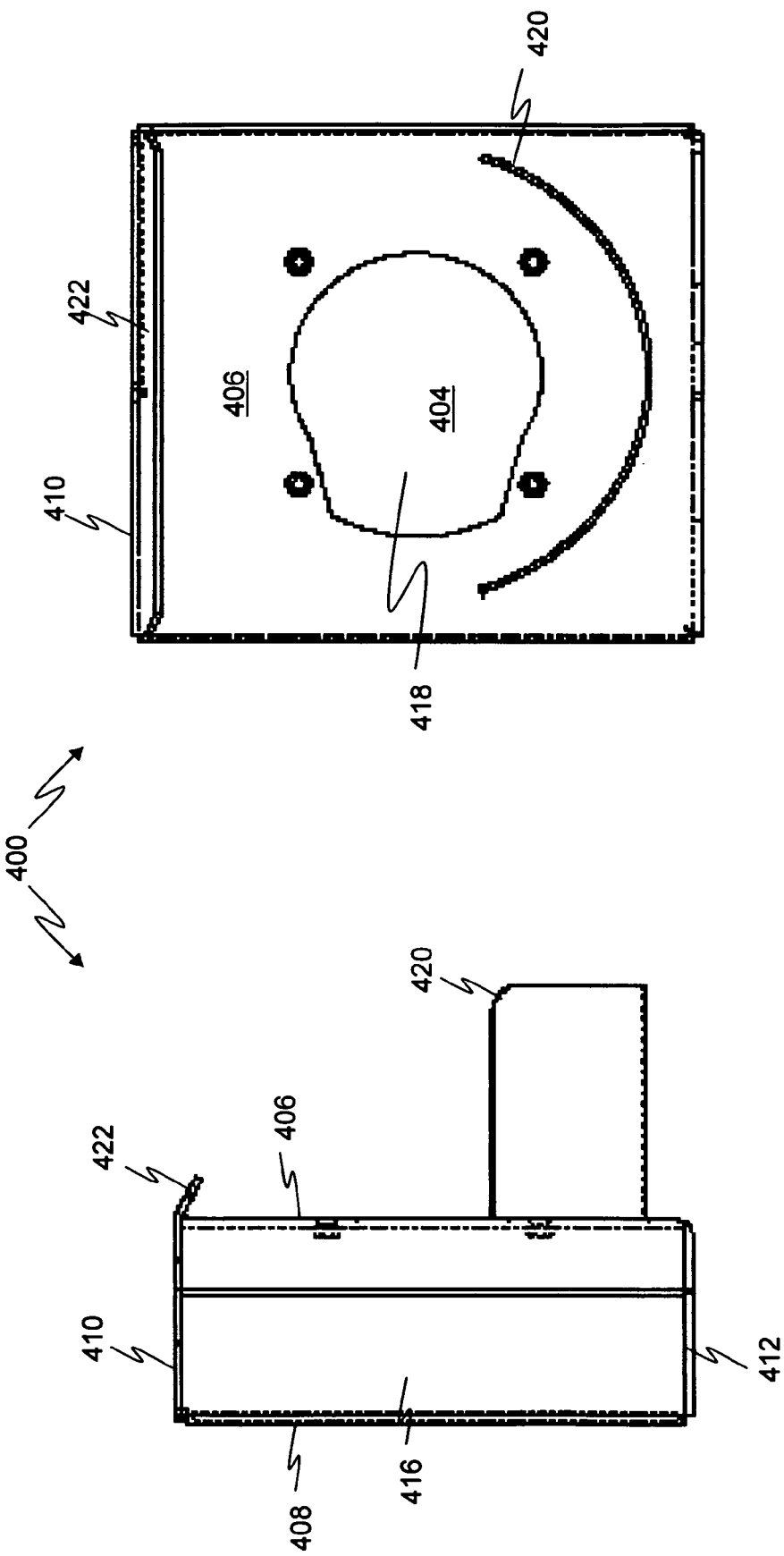

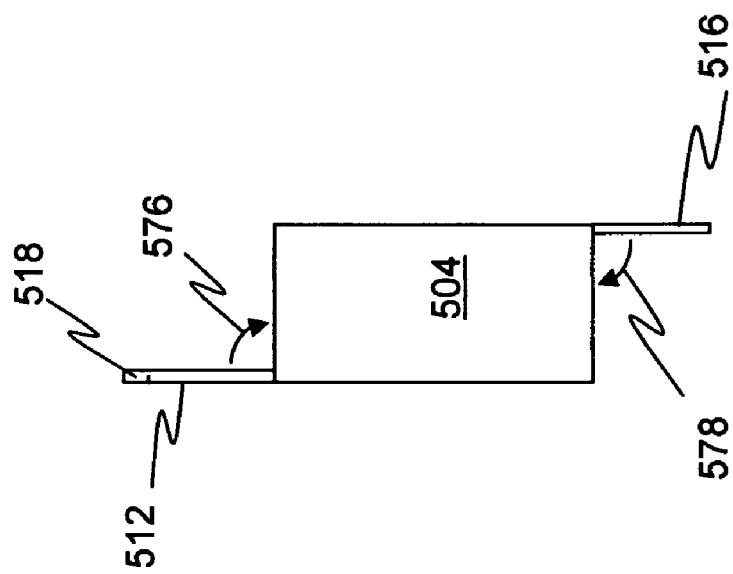
Figure 15
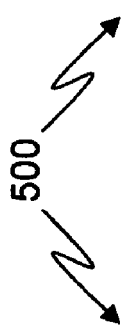
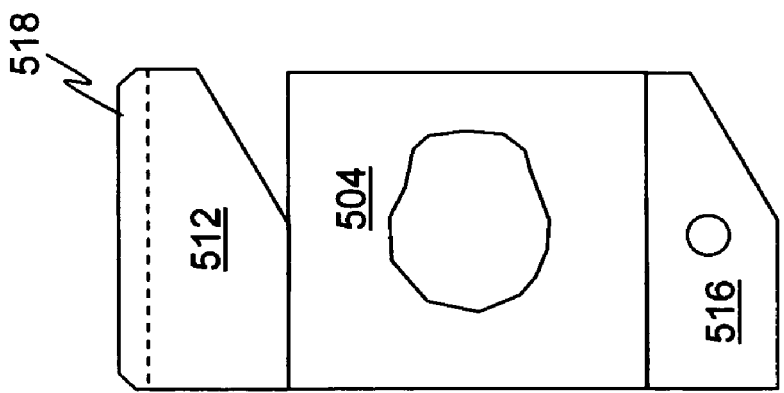
Figure 14

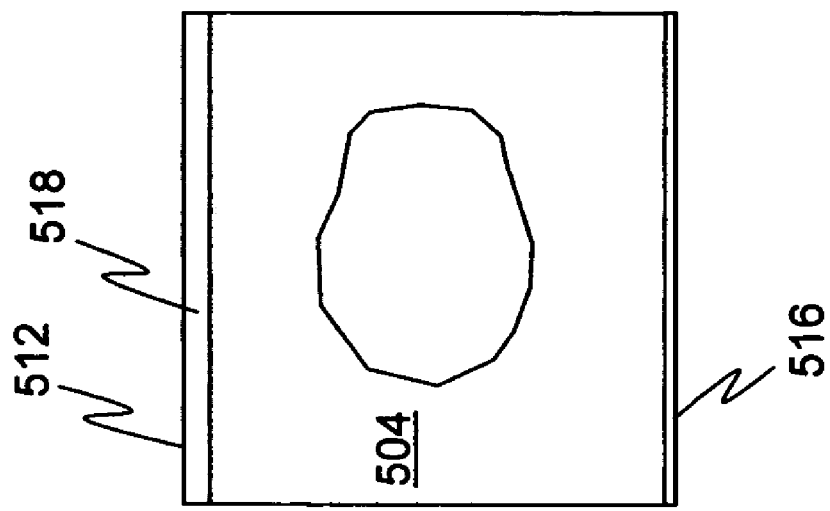
Figure 17
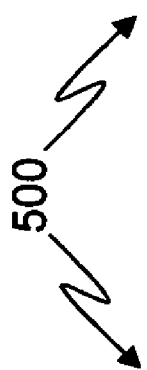
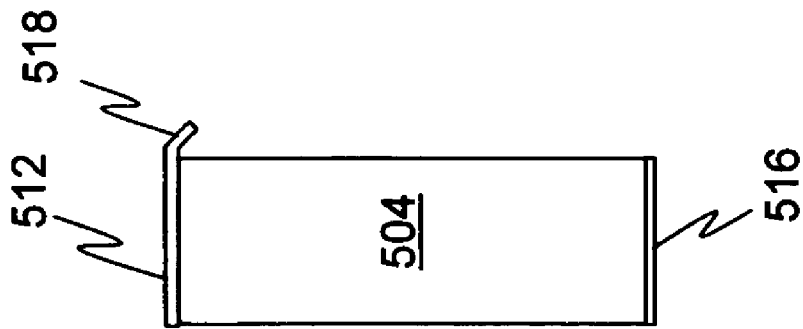
Figure 16

INTEGRATED MODULARITY DESIGN

FIELD OF THE INVENTION

The present invention relates generally to the development of a product and, more particularly, to the design and development of a product using an integrated part modularity design method.

BACKGROUND OF THE INVENTION

The creation of a product having a complicated geometrical configuration typically incorporates a plurality of pieces which are created individually and assembled together at a later time to create the finished product. This is because the tools needed to create these products, such as LASER cut machines, need to be reprogrammed each time a new product is produced and in some cases, the programming of these tools may be a time and labor intensive task. Thus, in order to reduce the cost of producing this type of product, each part is typically created in bulk and stored separately in stack inventory. As the product is needed, each of the pieces that are needed to produce the desired end product are removed from stack inventory and assembled together at a remote location.

Unfortunately however, this design and manufacturing approach has several disadvantages associated with it. One disadvantage involves the storage of the stack inventory, which may require a large amount of storage space. As discussed briefly hereinabove, stack inventory is typically required because the tool(s) needed to create the product component, such as a LASER cut machine, need to be set up, programmed and broken down for each type of product component produced. Thus, for a product having five (5) different types of product components, the machining tool must be set up, programmed and broken down five different times and depending upon the geometry of the product component, this process could require a substantial amount of time and labor. As such, it is more cost effective to manufacture each individual component in large quantities and store these components in stack inventory until they are needed for final product assembly. Unfortunately however, storage space is expensive and depending upon the number of components produced and the length of time the components are to be stored, the storage and inventory control costs could be substantial. For example, if a product requires five (5) pieces to complete its assembly and a thousand products are to be stored, then storage space large enough to accommodate five thousand pieces would be required. Moreover, if more than one type of multi-piece product is to be stored at the same time, then additional storage space would be required.

Another disadvantage involves the secondary operations or the assembly of the products having multiple pieces. Even though individual product pieces may be manufactured with a high degree of accuracy, the product must still be individually assembled and due to layout welding and/or snagging, these secondary operations can be labor intensive. Not only can this be a time consuming and labor intensive task, but it is possible for the finished product to be assembled together incorrectly. Thus, if such an error was not found immediately, the products that were assembled incorrectly would have to be disassembled and re-assembled correctly, effectively doubling the initial assembly time and cost.

Anther disadvantage involves the inventory control of pieces in stack inventory. With a large number of product pieces, it is inevitable that some pieces may be lost and/or damaged. Each of the damaged and undamaged components needs to be tracked and located via an inventory control system and the damaged and lost pieces need to be replaced. As above, in order to replace these pieces, the tool(s) needed to create the product component would have to be set up and re-programmed to replace the damaged and/or lost product, adding still more to the total cost.

Still another disadvantage involves the need for a large bending press to form or bend the material(s) into the desired end product shape. This is because the materials that are typically used require a large amount of tonnage in order to effectuate a bend in the material. This is undesirable because large bending presses are expensive to purchase and require a large amount of space to operate.

SUMMARY OF THE INVENTION

A method for developing a product is provided, wherein the method includes developing a three-dimensional product design, translating the three-dimensional product design into a two-dimensional product design, wherein the two-dimensional product design includes at least one product structure having at least two structure sections, obtaining a rigidly malleable material to create the at least one product structure, wherein the rigidly malleable material is obtained based on the two-dimensional product design, generating the at least one product structure by shaping the rigidly malleable material based on the two-dimensional product design such that the at least one product structure includes the at least two structure sections separated by at least one forming groove and at least one forming tab, the at least one forming tab having a forming tab height and a forming tab width and hand forming the product structure based on the at least one forming groove.

A machine-readable computer program code is provided, the program code including instructions for causing a controller to implement a method for developing a product represented by a three-dimensional product design, the method includes translating the three-dimensional product design into a two-dimensional product design, wherein the two-dimensional product design includes at least one product structure having at least two product sections, obtaining rigidly malleable material to create the at least one product structure, wherein the rigidly malleable material is obtained based on the two-dimensional product design, generating a product structure by shaping the rigidly malleable material based on the two-dimensional product design such that the product structure includes the at least two product sections separated by at least one forming groove and at least one forming tab and hand forming the product structure by bending the at least two product sections based on the at least one forming groove and the at least one forming tab.

A medium encoded with a machine-readable computer program code is provided, wherein the program code includes instructions for causing a controller to implement a method for developing a product represented by a three-dimensional product design, wherein the method includes translating the three-dimensional product design into a two-dimensional product design, wherein the two-dimensional product design includes at least one product structure having at least two product sections, obtaining rigidly malleable material to create the at least one product structure, wherein the rigidly malleable material is obtained based on the two-dimensional product design, generating a product structure by shaping the rigidly malleable material based on the two-dimensional product design such that the product structure includes the at least two product sections separated by at least one forming groove and at least one forming tab and hand forming the product structure by bending the at least two product sections based on the at least one forming groove and the at least one forming tab.

BRIEF DESCRIPTION OF THE FIGURES

The foregoing and other features and advantages of the present invention will be more fully understood from the following detailed description of illustrative embodiments, taken in conjunction with the accompanying drawings in which like elements are numbered alike in the several Figures:

FIG. 4 is a side view of the door stop assembly of FIG. 2;

FIG. 5 is a top down cross-sectional view of the door stop assembly of FIG. 2;

FIG. 7 is a chart illustrating a "hand bend calculator" for use with the method of FIG. 1;

FIG. 8 is a front perspective view of a Ditch Light Support created using the method of FIG. 1;

FIG. 9 is a top down view of the Ditch Light Support of FIG. 8;

FIG. 10 is a side view of the Ditch Light Support of FIG. 8;

FIG. 11 is a front view of the Ditch Light Support of FIG. 8;

FIG. 14 is a top down view of the two-dimensional product structure of FIG. 12 with the required bends partially completed per the method of FIG. 1;

FIG. 15 is a side view of the two-dimensional product structure of FIG. 14;

FIG. 16 is a side view of a Ditch Light Support with the required bends completed per the method of FIG. 1; and FIG. 17 is a front view of the Ditch Light Support of FIG. 16 completed per the method of FIG. 1.

Figure 1:
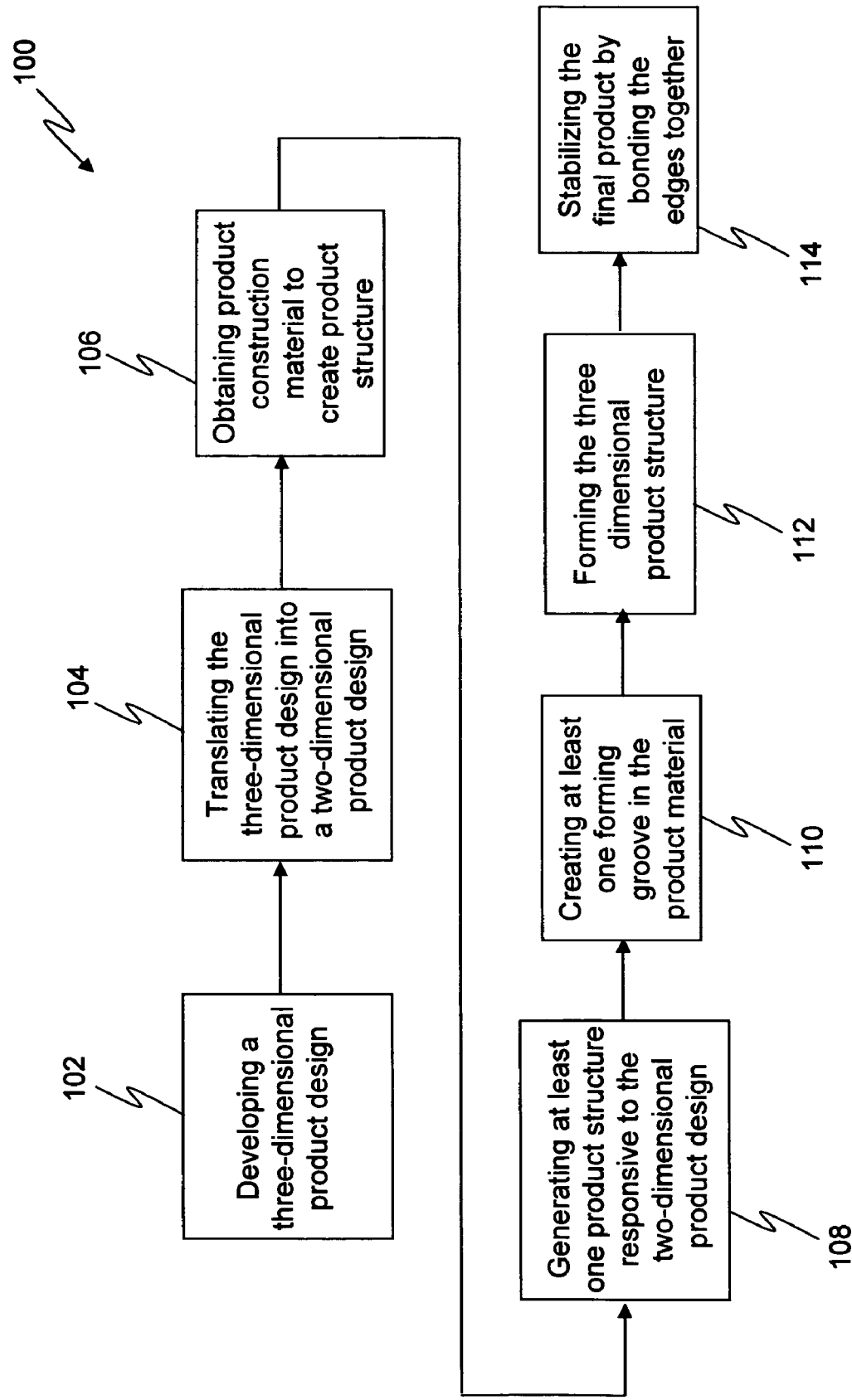
FIG. 1 is a block diagram illustrating an integrated part modularity design method, in accordance with an exemplary embodiment.
Figure 3:
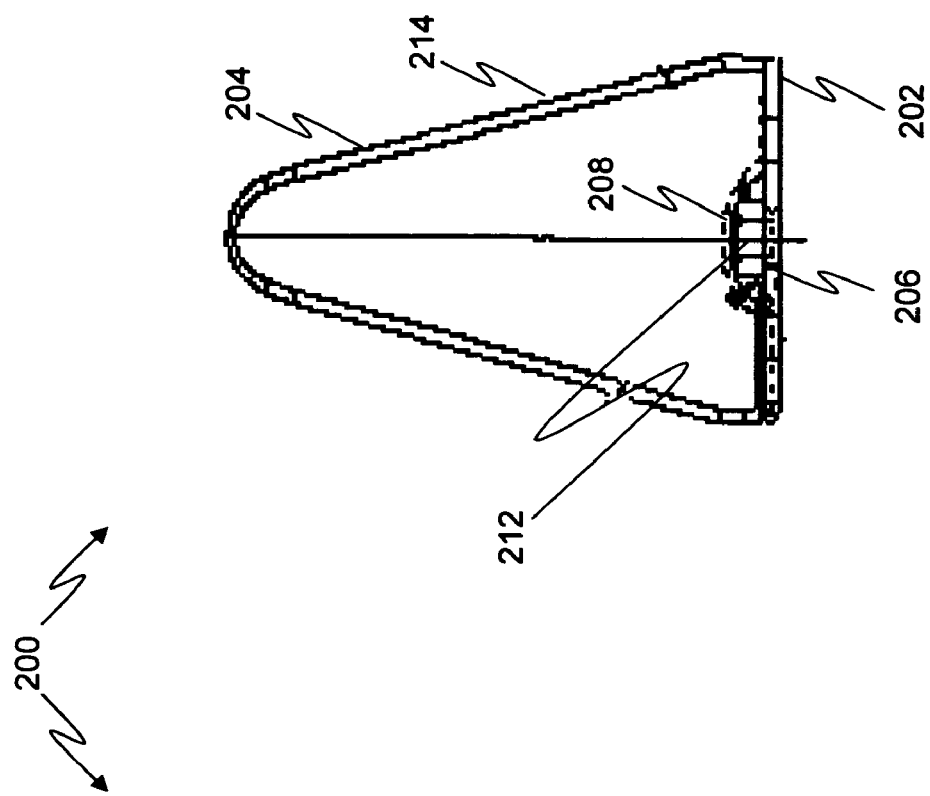
FIG. 3 is a front view of the door stop assembly of FIG. 2.

block 106, to construct the at least one product structure and the product structure may then be generated by shaping the material based on the two-dimensional product design, as shown in operational block 108. It should be appreciated that the product construction material is sheet material and may be any bondable and rigidly malleable material or combination of bondable and rigidly malleable materials suitable to the desired end purpose, such as aluminum, carbon steel, stainless steel and composite material, such as Ferris materials, Non-Ferris materials and Lexan®.

Additionally, the product construction material may be formed by cutting the two-dimensional product design from the product construction material using a saw to form the desired shape or the product construction material may be formed using any device and/or method suitable to the desired end purpose, such as a LASER cutting device, a plasma cutting device, a water cutting device and a punch forming device.

At least one forming groove is etched, punched or cut into the product construction material to define a "bend line" having at least one connector tab, as shown in operational block 110, wherein the at least one forming groove separates the two structure sections from each other and the at least one connector tab connects the two structure sections to each other. It should be appreciated that the number of connector tabs connecting the two structure sections should be chosen to achieve a desired amount of force that will be required to effectuate the bend. This may be accomplished by modifying the equation describing the existing relationship used to determine the force per inch, $T_{inch}$, for a given material. This existing relationship is described by:

$$T_{inch} = (((575 * M_{Thickness})^2 / W_{die}) / 12 * F_M);  \quad (1)$$

where $M_{Thickness}$ is the thickness of the material, $W_{die}$ is the width of the die and $F_M$ is the material factor. Modifying equation (1) to reflect the relationship between the connector tab(s) and a desired force per inch, $T_{inch}$, to effectuate the bend for a given material gives:

$$T_{inch} = (((575 * M_{Thickness})^2 / L_{SH}) / (12 * T_H * T_W * N_T * 2000 * F_M));  \quad (2)$$

where $T_{inch}$ is the push/pull force in pounds (lbs) required to effectuate the bend, $M_{Thickness}$ is the thickness of the material, $L_{SH}$ is the height of the shortest leg, $T_H$ is the height of the tab, $T_W$ is the width of the tab, $N_T$ is the number of tabs and $F_M$ is the material factor. As shown below, for certain material thicknesses and geometries, equation (2) may be simplified as follows:

$$N_T = \begin{cases} 2; & \text{if } L_{BL} < 6.0 \text{ inches, } M_{Thickness} = .060 \text{ in, } .090 \text{ in or } .120 \text{ in,} \\ (L_{BL}/6) + 1; & \text{if } L_{BL} \geq 6.0 \text{ inches, } M_{Thickness} = .060 \text{ in, } .090 \text{ in or } .120 \text{ in,} \\ 2; & \text{if } L_{BL} < 14.0 \text{ inches, } M_{Thickness} = .179 \text{ in, or } .250 \text{ in,} \\ (L_{BL}/14) + 1; & \text{if } L_{BL} \geq 14.0 \text{ inches, } M_{Thickness} = .179 \text{ in, or } .250 \text{ in,} \end{cases} \quad (3)$$

DETAILED DESCRIPTION OF THE INVENTION

Referring to FIG. 1, a block diagram illustrating a method 100 for developing a product is shown and includes developing a three-dimensional product design, as shown in operational block 102. The three-dimensional product design may then be translated into a two-dimensional product design including at least one product structure having at least two structure sections, as shown in operational block 104. Product construction material is obtained, as shown in operational where $L_{BL}$ is the length of the bend line in inches, $M_{Thickness}$ is the thickness of the material in inches and $N_T$ is the number of tabs required to achieve a desired amount of force adequate for product structure rigidity while allowing for the effectuation of the bend.

Using the bend line as a pivot point, the product structure may then be formed into a finished product by bending at least one of the at least two sections relative to the other at the forming groove, as shown in operational block 112. Upon achieving the desired shape, any edges disposed in proximity to other edges may be connected and/or bonded together, via any method suitable to the desired end purpose, such as a tack weld, in order to provide some extra stability and/or sealability to the final product, as shown in operational block 114. It is contemplated that products having a medium to highly complex geometry may be created using method 100, wherein a portion of the required bends may be effectuated via a large bending press and the remaining portion of the required bends may be effectuated by hand bending alone and/or by hand bending using a small hand tool, including but not limited to, bends that may be partially performed using a large bending press and completed using hand bending alone and/or a small hand tool.

It should be appreciated that the implementation of the forming groove and the connecting tab allows for the creation of a product having at least three-dimensions without the need for a large machine to bend the product material. The positioning of the forming groove(s) and the connector tab(s) allow each of the at least two sections to be bent relative to each other using a light machine and/or by hand. Thus, the at least one forming groove(s) and the at least one connector tab(s) should be disposed and sized to achieve a predetermined maximum and/or minimum required bending force, as described hereinabove. For example, if the thickness of the forming groove is too wide, then the height of the connector tab(s) may be relatively large and the force required to bend the material may be very small resulting in a product that may be subject to unintentional deformation and/or breaking. On the other hand, if the thickness of the forming groove is too thin, then the height of the connector tab(s) may be relatively small and the force required to bend the material may be very large, resulting in a product that would require a large machine to bend and shape, thus negating the purpose of the forming groove.

The implementation of the forming groove and the connecting tab may allow for the development of products having more complex geometries (such as products having enclosed sections) than is currently achievable using large bending machines. Moreover, it should be appreciated that depending upon the particular application and/or product, the depth of the forming groove may completely traverse the material thickness and/or may only partially traverse the material thickness. Additionally, although the size of the forming groove may be any size suitable to the desired end purpose, the width of the forming groove should be approximately half the size of the material thickness. This allows for the forming groove to be fillet/seam welded upon completion of the hand bend effectuation and provides for a rigid, yet bendable product.

Referring to FIGS. 2-5, the construction of a product having a relatively simple geometry, such as a door stop assembly 200, using method 100 is shown and described hereinbelow. Door stop assembly 200 includes a door stop base structure 202 and a door stop support structure 204. Door stop base structure 202 defines a mounting cavity 206 and includes a mounting nut 208 having a threaded portion 210 which defines a mounting nut cavity 212. Mounting nut 208 is non-movably disposed relative to mounting cavity 206 such that mounting nut cavity 212 is communicated with mounting cavity 206. Implementing method 100 to develop door stop assembly 200 in accordance with an exemplary embodiment, a three-dimensional product design 214 is created for door stop assembly 200, as shown in operational block 102, wherein the three-dimensional product design 214 is shown in FIGS. 2-5.

Figure 6:
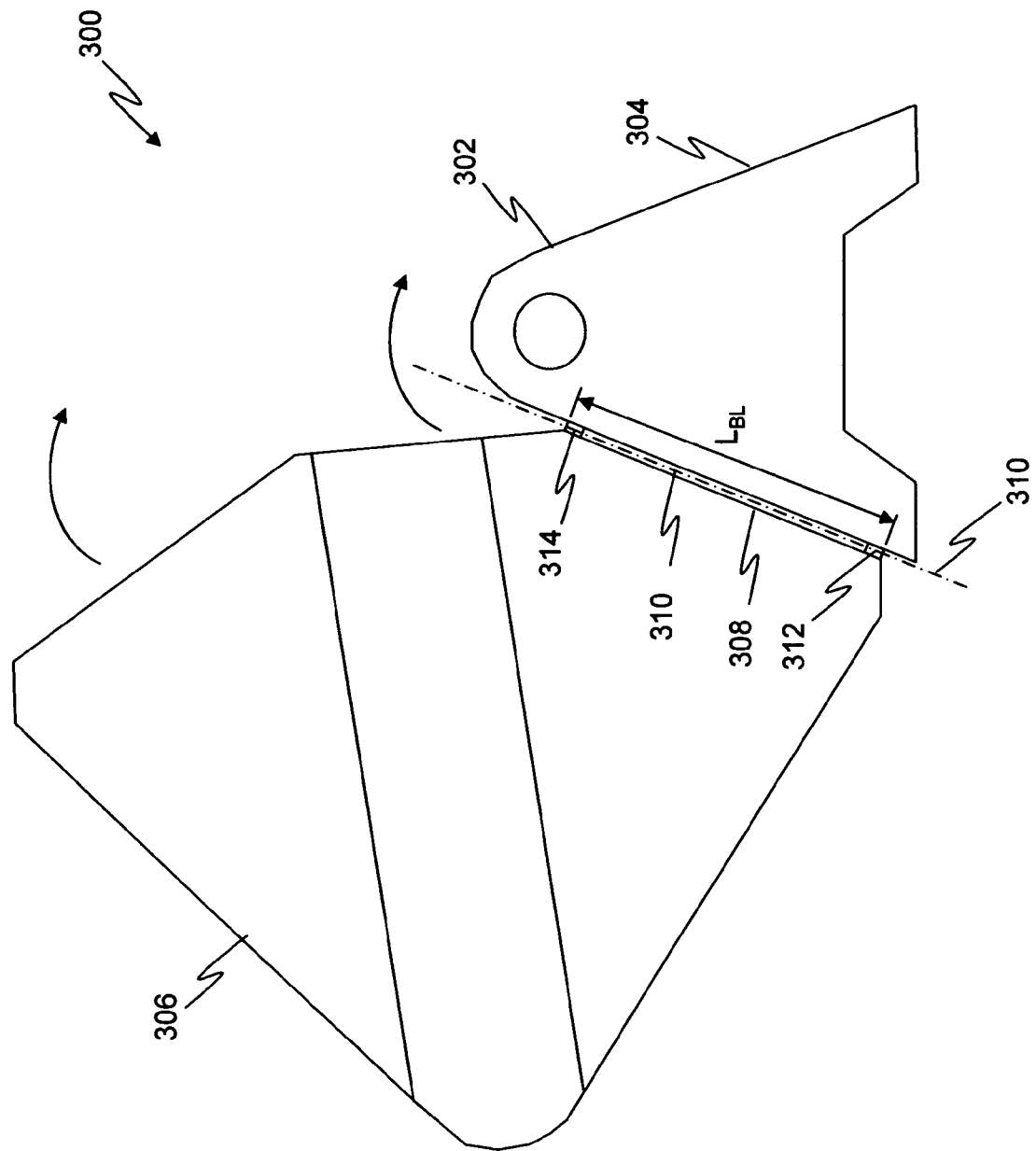
FIG. 6 is a top down view of a two-dimensional product structure for the door stop assembly of FIG. 2.

Referring to FIG. 6, the three-dimensional product design 214 is then translated into a two-dimensional product design 300 of door stop assembly 200, wherein two-dimensional product design 300 includes a product structure 302 having a first section 304 and a second section 306, as shown in operational block 104. A bondable and rigidly malleable material needed to create the product structure 302 is obtained, as shown in operational block 106, and the product structure 302 is generated by forming the bondable and rigidly malleable material into the two-dimensional product design 300, as shown in operational block 108. This may be accomplished by cutting the shape of the two-dimensional product design 300 from the material to create a physical representation of the two-dimensional product design 300. As the product structure 302 is being generated, a forming groove 308 is cut into the product structure 302 to define a bend line 310 having a bend line length $L_{BL}$ such that the first section 304 is separated from the second section 306 by the bend line 310, as shown in operational block 110. The length of the forming groove (LFG) 308 is shorter than the bend line length $L_{BL}$ such that the first section 304 is connected to second section 306 via a first tab 312 and a second tab 314, wherein first tab 312 and second tab 314 are disposed adjacent the edge of product structure 302 at each end of the bend line 310.

Product structure 302 is then formed into the finished door stop assembly 200 by using the bend line 310 as a pivot point and bending first section 304 relative to second section 306 and based on bend line 310, as shown in operational block 112. The components of the final product may then be bonded together to form a more secure and/or a sealed product, a shown in operational block 114. It should be appreciated that the size, shape and/or positioning of the forming groove 308, the first tab 312 and the second tab 314 allows the first section 304 and/or the second section 306 to be bent easily relative to each other.

It should also be appreciated that the size of forming groove 308, first tab 312 and/or second tab 314 may be based on at least one of the type of bondable and rigidly malleable material used to construct the product structure 302 and the thickness of the rigidly malleable material used to construct the product structure 302, as described hereinabove. Referring to FIG. 7, an example of a "hand bend calculation table" 398 implementing equation 2 described hereinabove is shown and illustrates the relationship between the forming groove(s) and tab(s) defining the base line and the material thickness $M_{Thickness}$. As such, the hand bend calculation table 398 may be used to determine the size of forming groove(s) 308 as a function of material thickness $M_{Thickness}$. Hand bend calculation table 398 not only provides the size of the forming groove(s) for a material thickness $M_{Thickness}$, but the hand bend calculation table 398 also defines the number of tabs required along the bend line 308 to effectuate the bending of the material, wherein a tab may be disposed at each end of the bend line 310 beginning at the edge of the material. It should also be appreciated that when additional tabs are required, the tabs should be equally spaced along the bend line length $L_{BL}$. Additionally, the lower portion of hand bend calculation table 398 allows for the manipulation of the number of tabs required along bend line 310, which may be useful when the length of bend line 310 is extremely long and/or the calculated tab requirement exceeds a predetermined maximum push/pull force. For example, to minimize the hand bend force required to form product structure 302, insert a lower number of tabs along bend line 310 and to maximize the hand bend force required to form product structure 302, insert a greater number of tabs along bend line 310.

Figure 2:
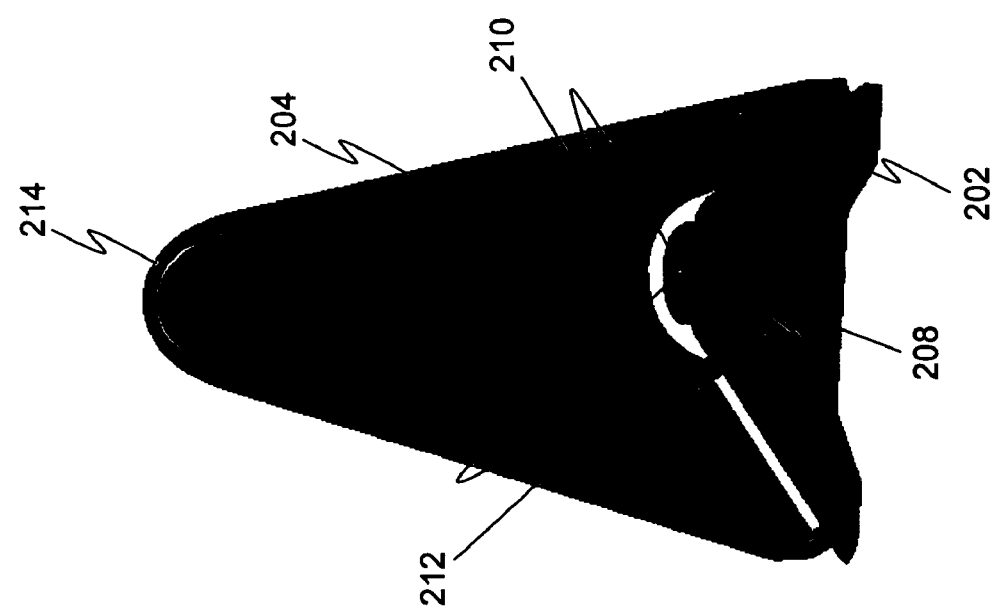
FIG. 2 is a side perspective view of a door stop assembly created using the method of FIG. 1.

Referring to FIGS. 1 and 8-11, the construction of a product having a more complex geometry than the door stop assembly 200 of FIG. 2, such as a Ditch Light Support (DLS) 400, using method 100 is shown and described hereinbelow. DLS 400 includes a DLS structure 402 defining a DLS cavity 404 and having a DLS front portion 406, a DLS rear portion 408, a DLS top portion 410, a DLS bottom portion 412, a first DLS side portion 414 and a second DLS side portion 416, wherein DLS front portion 406 includes a front opening 418 communicated with DLS cavity 404. DLS structure 402 also includes a DLS arcing portion 420 and a DLS flange portion 422, wherein DLS arcing portion 420 extends out of and away from DLS front portion 406 and DLS flange portion 422 extends out of and away from DLS top portion 410 in the direction of DLS front portion 406. Implementing method 100 to develop DLS 400 in accordance with an exemplary embodiment, a three-dimensional product design 424 is created for DLS 400, as shown in operational block 102, wherein the three-dimensional product design 424 is shown in FIGS. 8-11.

Figure 12:
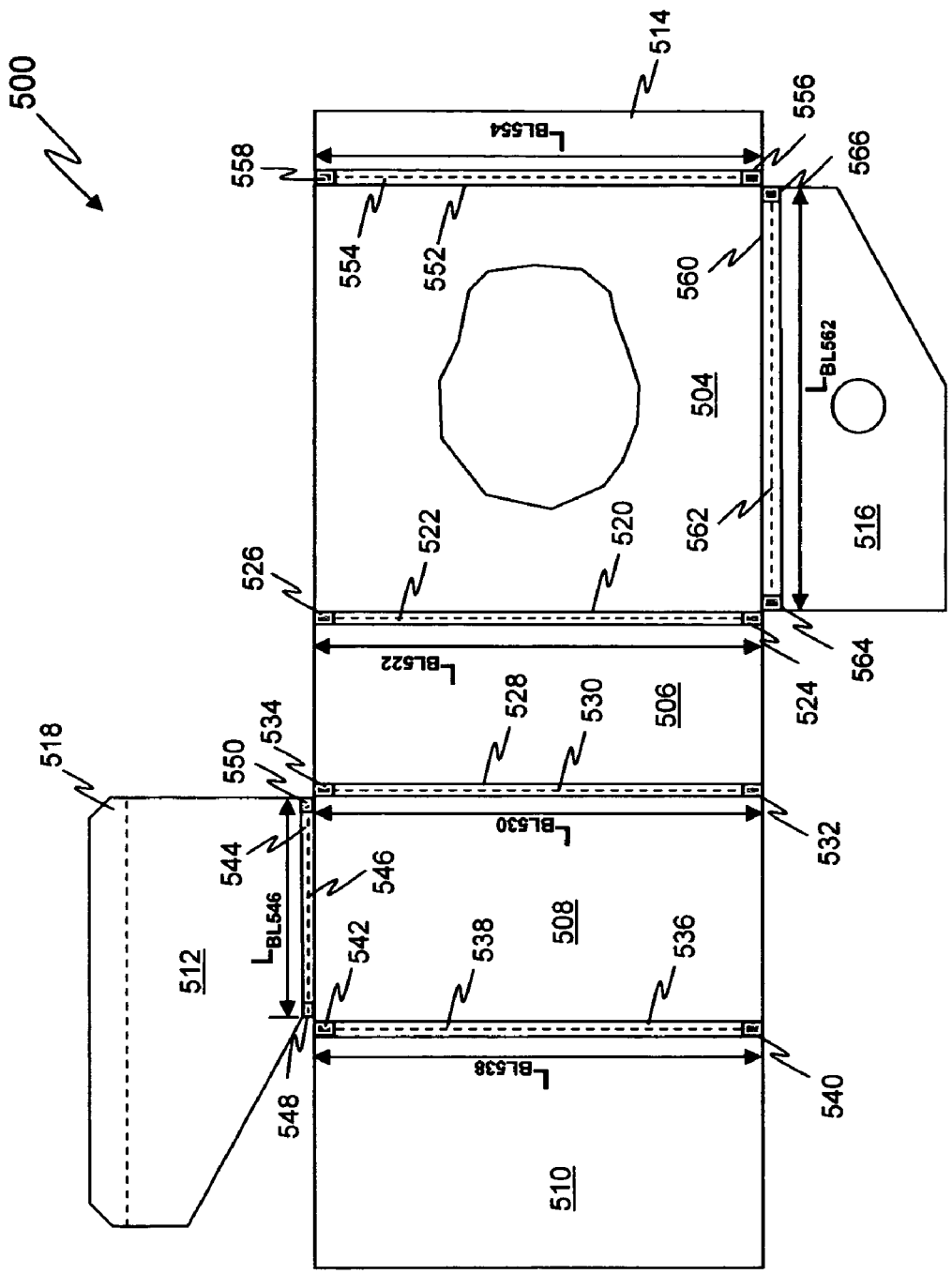
FIG. 12 is a top down view of a two-dimensional product structure for the Ditch Light Support of FIG. 8.
Figure 13:
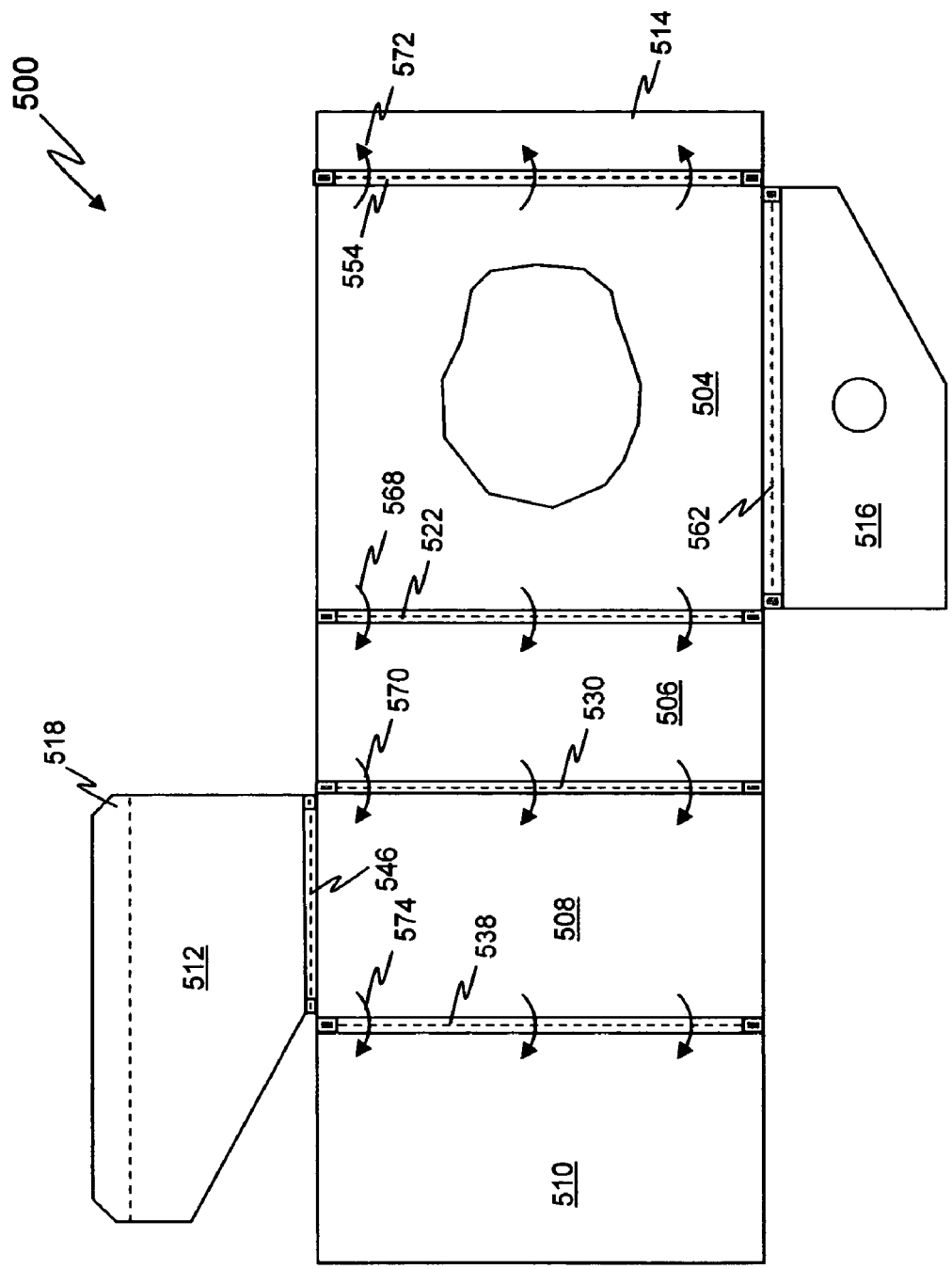
FIG. 13 is a top down view of the two-dimensional product structure of FIG. 12 showing the bend lines and the direction of effectuated bends per the method of FIG. 1.

Referring to FIG. 12, the three-dimensional product design 424 is translated into a two-dimensional product design 500 of DLS 400, wherein the two-dimensional product 500 includes a product structure 502 having a first section 504, a second section 506, a third section 508, a fourth section 510, a fifth section 512, a sixth section 514, a seventh section 516 and a flanged section 518, as shown in operational block 104. A suitable bondable, such as by welding, and rigidly malleable material [such as steel or aluminum] needed to create the product structure 502 is obtained, as shown in operational block 106, and the product structure 502 is generated by forming the bondable and rigidly malleable material into the two-dimensional product design 500, as shown in operational block 108. As described hereinabove, this may be accomplished by cutting the shape of the two-dimensional product design 500 from the bondable and rigidly malleable material to create a physical representation of the two-dimensional product design 500. As shown in operational block 110, a first forming groove 520 is cut into the product structure 502 to be disposed between the first section 504 and the second section 506 to define a first bend line 522 having a first bend line length $L_{BL522}$. The first bend line 522 is disposed to separate the first section 504 from the second section 506 such that the first section 504 is connected to the second section 506 via a first tab 524 disposed on one end of the first forming groove 520 and a second tab 526 disposed on the opposing end of the first forming groove. As such, it should be appreciated that the length of the first forming groove 520 is less than the first bend line length $L_{BL522}$.

A second forming groove 528 is cut into the product structure 502 to be disposed between second section 506 and third section 508 to define a second bend line 530 having a second bend line length $L_{BL530}$. The second bend line 530 is disposed to separate the second section 506 from the third section 508 such that the second section 506 is connected to third section 508 via a third tab 532 disposed on one end of the second forming groove 528 and a fourth tab 534 disposed on the opposing end of the second forming groove 528. Similarly, it should be appreciated that the length of the second forming groove 528 is less than the second bend line length $L_{BL530}$. A third forming groove 536 is cut into the product structure 502 to be disposed between the third section 508 and the fourth section 510 to define a third bend line 538 having a third bend line length $L_{BL538}$. The third bend line 538 is disposed to separate the third section 508 from the fourth section 510 such that the third section 508 is connected to fourth section 510 via a fifth tab 540 disposed on one end of the third forming groove 536 and a sixth tab 542 disposed on the opposing end of the third forming groove 536. It should also be appreciated that the length of the third forming groove 536 is less than the third bend line length $L_{BL538}$.

A fourth forming groove 544 is cut into the product structure 502 to be disposed between the third section 508 and the fifth section 512 to define a fourth bend line 546 having a fourth bend line length $L_{BL546}$. The fourth bend line 546 is disposed to separate the third section 508 from the fifth section 512 such that the third section 508 is connected to the fifth section 512 via a seventh tab 548 disposed on one end of the fourth forming groove 544 and an eighth tab 550 disposed on the opposing end of the fourth forming groove 544. As such, it should also be appreciated that the length of the fourth forming groove 544 is less than the fourth bend line length $L_{BL546}$. Additionally, a fifth forming groove 552 is cut into the product structure 502 to be disposed between the first section 504 and the sixth section 514 to define a fifth bend line 554 having a fifth bend line length $L_{BL554}$. As above, the fifth bend line 554 is disposed to separate the first section 504 from the sixth section 514 such that the first section 504 is connected to the sixth section 514 via a ninth tab 556 disposed on one end of the fifth forming groove 552 and a tenth tab 558 disposed on the opposing end of fifth forming groove 552. As such, it should be appreciated that the length of the fifth forming groove 552 is less than the fifth bend line length $L_{BL554}$. Furthermore, a sixth forming groove 560 is cut into the product structure 502 to be disposed between the first section 504 and the seventh section 516 to define a sixth bend line 562 having a sixth bend line length $L_{BL562}$. The sixth bend line 562 is disposed to separate the first section 504 from the seventh section 516 such that the first section 504 is connected to seventh section 516 via an eleventh tab 564 disposed on one end of the sixth forming groove 560 and a twelfth tab 566 disposed on the opposing end of the sixth forming groove 560. As such, it should be appreciated that the length of the sixth forming groove 560 is less than the sixth bend line length $L_{BL562}$.

It should be noted that for simplicity, it is assumed that thickness of the material ($M_{Thickness}$) used to construct DLS 400 is 0.060 inches and that the bend line lengths $L_{BL522}$, $L_{BL530}$, $L_{BL538}$, $L_{BL546}$, $L_{BL554}$ and $L_{BL562}$ are each less than 6.0 inches in length. As such, Equation (3) above indicates that the number of tabs required to rigidly allow for the effectuation of the hand bend process for each bend line is two (2) tabs per bend line. However, it should be appreciated that the number of required tabs may be different for varying material thicknesses and bend line lengths and as such Equation (3) should be used as required.

The product structure 502 is then formed into the finished Ditch Light Support 400 by effectuating the bending of each of the sections about its respective bend line, as shown in operational block 112. As shown in FIGS. 13-17 this may be accomplished by bending the first section 504 and/or the second section 506 about the first bend line 522 in the direction of arrows 568 until the first section 504 and the second section 506 are perpendicular to each other. The second section 506 and/or the third section 508 are bent about the second bend line 530 in the direction of arrows 570 until the second section 506 and the third section 508 are perpendicular to each other and the first section 504 and/or the sixth section 514 are bent about the fifth bend line 554 in the direction of arrows 572 until the first section 504 and the sixth section 514 are disposed perpendicular to each other. The third section 508 and/or the fourth section 510 are then bent about the third bend line 538 in the direction of arrows 574 until the outer edge of the fourth section 510 is disposed in proximity to the outer edge of the sixth section 514. At this point, the first section 504, the second section 506, the third section 508, the fourth section 510 and the sixth section 514 partially define the DLS cavity 404.

The fifth section 512 and/or the third section 508 are bent about fourth bend line 546 in the direction of arrow 576 such that the fifth section 512 is perpendicular to each of the first section 504, the second section 506, the third section 508, the fourth section 510 and the sixth section 514. Additionally, the outer edges of the fifth section 512 are disposed adjacent the outer edges of the first section 504, the second section 506, the third section 508, the fourth section 510 and the sixth section 514 to partially enclose the DLS cavity 404. In a similar fashion, the seventh section 516 and/or the third section 508 are bent about sixth bend line 562 in the direction of arrow 578 such that the seventh section 516 is perpendicular to each of the first section 504, the second section 506, the third section 508, the fourth section 510 and the sixth section 514. Moreover, the outer edges of the seventh section 516 are disposed adjacent the outer edges of the first section 504, the second section 506, the third section 508, the fourth section 510 and the sixth section 514 to completely enclose the DLS cavity 404. Flanged section 518 may then be bent toward the second section 506 a predetermined number of degrees as desired, wherein the mass of the flange is given by:

$$M_{Flange} = L_{Flange} * W_{Flange} * 0.2830; \quad (4)$$

Where $M_{Flange}$ is the mass or weight of the Flange in pounds, $L_{Flange}$ is the length of the flange in inches and $W_{Flange}$ is the width of the flange in inches.

Upon achieving the desired shape, any edges disposed in proximity to other edges may be connected together, in whole or in part, via any method suitable to the desired end purpose, such as a tack weld or a seam weld, in order to provide some extra stability to the final product, as shown in operational block 114. It should also be appreciated that the edges may be welded and/or sealed together to allow DLS cavity 404 to be watertight.

Method 100 allows for hand forming bend resistance without the need for additional large leverage tooling. However, if the bending force (i.e. push/pull force) required to form the product structure into a finished product exceeds a predetermined force, assistant leverage tools may be used to complete the hand bending process. Moreover, when combining geometry, flat pattern designs may become complex. As such, although not required, it is preferred that the flat pattern geometry of the product structure be in a square configuration as much as possible.

In accordance with an exemplary embodiment, the processing of FIG. 1 may be implemented, wholly or partially, by a controller operating in response to a machine-readable computer program. In order to perform the prescribed functions and desired processing, as well as the computations therefore (e.g. execution control algorithm(s), the control processes prescribed herein, and the like), the controller may include, but not be limited to, a processor(s), computer(s), memory, storage, register(s), timing, interrupt(s), communication interface(s), and input/output signal interface(s), as well as combination comprising at least one of the foregoing.

Moreover, the invention may be embodied in the form of a computer or controller implemented processes. The invention may also be embodied in the form of computer program code containing instructions embodied in tangible media, such as floppy diskettes, CD-ROMs, hard drives, and/or any other computer-readable medium, wherein when the computer program code is loaded into and executed by a computer or controller, the computer or controller becomes an apparatus for practicing the invention. The invention can also be embodied in the form of computer program code, for example, whether stored in a storage medium, loaded into and/or executed by a computer or controller, or transmitted over some transmission medium, such as over electrical wiring or cabling, through fiber optics, or via electromagnetic radiation, wherein when the computer program code is loaded into and executed by a computer or a controller, the computer or controller becomes an apparatus for practicing the invention. When implemented on a general-purpose microprocessor the computer program code segments may configure the microprocessor to create specific logic circuits.

While the invention has been described with reference to an exemplary embodiment, it will be understood by those skilled in the art that various changes, omissions and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

What is claimed is:

1. A method for developing a product, the method comprising
    developing a three-dimensional product design;
    translating said three-dimensional product design into a two-dimensional product design, wherein said two-dimensional product design includes at least one product structure having at least two structure sections;
    obtaining a rigidly malleable material to create said at least one product structure, wherein said rigidly malleable material is a sheet material selected based on said two dimensional product design;
    generating said at least one product structure by shaping said rigidly malleable material based on said two-dimensional product design such that said at least one product structure includes said at least two structure sections separated by at least one forming groove and at least one forming tab, said at least one forming tab having a forming tab height and a forming tab width, wherein the number of at least one of said at least one forming groove and said at least one forming tab is determined by dividing a first parameter by a second parameter,
    wherein the first parameter is determined by dividing the square of the product of 575 and the material thickness by the shortest distance between the forming groove and an edge of the rigidly malleable material and,
    wherein the second parameter is determined by the product of 24000, a tab height, a tab width, a number of forming tabs and a material factor, wherein the material factor based on said rigidly malleable material
    wherein $T_{inch}$ is a desired push/pull force in pounds (lbs), $M_{Thickness}$ is the thickness of said groove and an edge of said rigidly malleable material, T is said tab height, T is said tab; and
    hand forming said product structure based upon said at least one forming groove.

2. The method of claim 1, wherein said developing includes generating an electronic representation of said three-dimensional product design.

3. The method of claim 1, wherein said translating includes generating an electronic representation of said two-dimensional product design.

4. The method of claim 1, wherein generating includes generating at least one of said at least one forming groove and said at least one forming tab wherein said at least one of said at least one forming groove and said at least one forming tab is rectangular in shape and includes a right angle corner.

5. The method of claim 1, wherein generating includes generating at least one of said at least one forming groove and said at least one forming tab, wherein at least one of said at least one forming groove and said at least one forming tab is sized and shaped based on said rigidly malleable material.

6. The method of claim 1, wherein said at least one forming groove includes a plurality of forming grooves, wherein the number of said plurality of forming grooves is based on said rigidly malleable material.

7. The method of claim 1, wherein said at least one forming tab includes a plurality of forming tabs, wherein the number of said plurality of forming tabs is based on said rigidly malleable material.

8. The method of claim 1, wherein said generating includes generating said at least one product structure such that said at least one of said at least one forming groove and said at least one forming tab defines a bend line associated with said at least one product structure, said bend line separating said at least two structure sections from each other.

9. The method of claim 8, wherein generating includes generating at least one of said at least one forming groove and said at least one forming tab, wherein said at least one forming tab includes a first forming tab and a second forming tab, wherein said first forming tab and second forming tab are disposed adjacent opposing ends of said bend line.

10. The method of claim 1, wherein said generating includes forming said rigidly malleable material to form a physical representation of said two-dimensional product design.

11. The method of claim 1, wherein said generating includes forming said rigidly malleable material using at least one of a saw, a LASER cutting device, a Water cutting device, a Plasma cutting device and a punch forming device.

12. The method of claim 1, wherein said generating includes generating said at least one forming groove using at least one of a saw, a LASER cutting device, a Water cutting device, a Plasma cutting device and a punch forming device.

13. The method of claim 1, wherein said hand forming includes bending said at least two structure sections based on to said at least one forming tab and said at least one forming groove.

14. The method of claim 1, wherein said hand forming includes bending said at least two structure sections using a hand tool.

15. The method of claim 1, wherein said rigidly malleable material is a bondable material.

16. The method of claim 1, wherein said rigidly malleable material includes at least one of aluminum, carbon steel, stainless steel and composite material.

17. A physical storage medium encoded with a machine-readable computer program code, the program code including instructions for causing a controller to implement a method for developing a product represented by a three-dimensional product design, the method comprising:
translating the three-dimensional product design into a two-dimensional product design, wherein said two-dimensional product design includes at least one product structure having at least two product sections;
obtaining rigidly malleable material to create said at least one product structure, wherein said rigidly malleable material is obtained based on said two-dimensional product design;
generating a product structure by shaping said rigidly malleable material base on said two-dimensional product design such that said product structure includes said at least two product sections separated by at least one forming groove and at least one forming tab, wherein the number of least one of said at least one forming groove and said at least one forming tab is determined by dividing a first parameter by a second parameter,
wherein the first parameter is determined by dividing the square of the product of 575 and the material thickness by the shortest distance between the forming groove and an edge of the rigidly malleable material and,
wherein the second parameter is determined by the product of 24000, a tab height, a tab width, a number of forming tabs and a material factor, wherein the material factor based on said rigidly malleable material $$T_{inch} = (((575*M_{Thickness})^2/L_{SH})/(12*T_H*T_W*N_T*2000*F_M)),$$

rigidly malleable material in inches, L is the shortest distance between said forming rigidly malleable material; and
hand forming said product structure by bending said at least two product sections based on said at least one forming groove and said at least one forming tab.

18. A machine-readable computer program code on a physical storage medium, the program code including instructions for causing a controller to implement a method for developing a product represented by a three-dimensional product design, the method comprising:
translating the three-dimensional product design into a two-dimensional product design, wherein said two-dimensional product design includes at least one product structure having at least two product sections;
obtaining rigidly malleable material to create said at least one product structure, wherein said rigidly malleable material is obtained based on said two-dimensional product design;
generating a product structure by shaping said rigidly malleable material based on said two-dimensional product design such that said product structure includes said at east two product sections separated by at least one forming groove and at least one forming tab, wherein the number of at least one of said at least one forming groove and said at least one forming tab is determined by dividing a first parameter by a second parameter,
wherein the first parameter is determined by dividing the square of the product of 575 and the material thickness by the shortest distance between the forming groove and an edge of the rigidly malleable material and,
wherein the second parameter is determined by the product of 24000, a tab height, a tab width, a number of forming tabs and a material factor, wherein the material factor based on said rigidly malleable material $$T_{inch} = (((575*M_{Thickness})^2/L_{SH})/(12*T_H*T_W*N_T*2000*F_M)),$$

rigidly malleable material in inches, L is the shortest distance between said forming rigidly malleable material; and
hand forming said product structure by bending said at least two product sections based on said at least one forming groove and said at least one forming tab.

* * * * *